(12) United States Patent
Takemori et al.

(10) Patent No.: US 8,008,675 B2
(45) Date of Patent: Aug. 30, 2011

(54) PACKAGE FOR MOUNTING AN OPTICAL ELEMENT AND A METHOD OF MANUFACTURING THE SAME

(75) Inventors: Hideaki Takemori, Hitachinaka (JP); Satoshi Higashiyama, Hitachinaka (JP); Kazuhiro Hirose, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 367 days.

(21) Appl. No.: 10/988,521

(22) Filed: Nov. 16, 2004

(65) Prior Publication Data

US 2005/0132747 A1 Jun. 23, 2005

(30) Foreign Application Priority Data

Dec. 18, 2003 (JP) ................. 2003-420285

(51) Int. Cl.
*H01L 33/00* (2010.01)
(52) U.S. Cl. ............ 257/98; 257/99; 257/E33.058
(58) Field of Classification Search .......... 257/81, 257/513, 520, E33.056, E33.058, E33.059, 257/98–100, 79, 433, 434, 774, 676, E33.057; 438/22, 26

See application file for complete search history.

(56) References Cited

U.S. PATENT DOCUMENTS

| | | | |
|---|---|---|---|
| 4,651,192 A * | 3/1987 | Matsushita et al. ........... | 257/705 |
| 4,729,010 A | 3/1988 | Tsuchiya et al. | |
| 5,674,758 A | 10/1997 | McCarthy | |
| 6,424,050 B1 | 7/2002 | Komiyama | |
| 6,573,580 B2 * | 6/2003 | Arndt ............................ | 257/433 |
| 6,599,768 B1 | 7/2003 | Chen | |
| 6,730,533 B2 * | 5/2004 | Durocher et al. ............... | 438/26 |
| 7,166,873 B2 * | 1/2007 | Okazaki ......................... | 257/98 |
| 7,170,101 B2 * | 1/2007 | Tatsumi et al. ................. | 257/94 |
| 2002/0190371 A1 | 12/2002 | Mashino et al. | |
| 2004/0264866 A1 * | 12/2004 | Sherrer et al. .................. | 385/49 |
| 2004/0266058 A1 * | 12/2004 | Lee et al. ....................... | 438/106 |
| 2005/0180701 A1 * | 8/2005 | Steinberg et al. ............... | 385/92 |

FOREIGN PATENT DOCUMENTS

| | | |
|---|---|---|
| CN | 1340864 A | 3/2002 |
| JP | 9-083072 | 3/1997 |
| JP | 11-265957 | 9/1999 |
| JP | 2000-138305 | 5/2000 |
| JP | 2000-261041 A | 9/2000 |
| JP | 2000-269555 A | 9/2000 |
| JP | 2000-294831 | 10/2000 |
| JP | 2001-308443 | 11/2001 |

* cited by examiner

*Primary Examiner* — Jerome Jackson, Jr.
(74) *Attorney, Agent, or Firm* — Dickstein Shapiro LLP

(57) ABSTRACT

The optical mounting package of the present invention is featured by mounting a silicon frame on an insulating substrate for mounting the optical element. The package of the present invention is also featured by that the frame mounted on the insulating substrate for mounting the optical element is made of silicon. A method of manufacturing the package of the present invention is featured by mounting the silicon wafer on the insulating substrate.

20 Claims, 6 Drawing Sheets

FIG. 5a
FIG. 5b
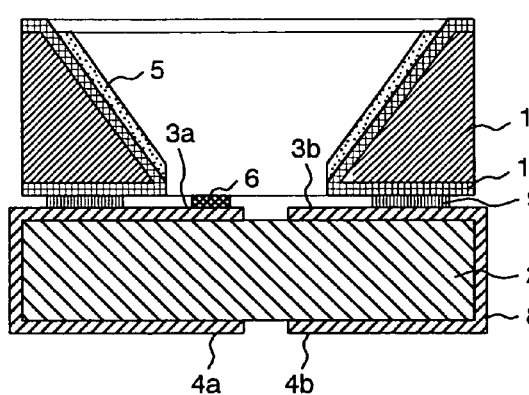
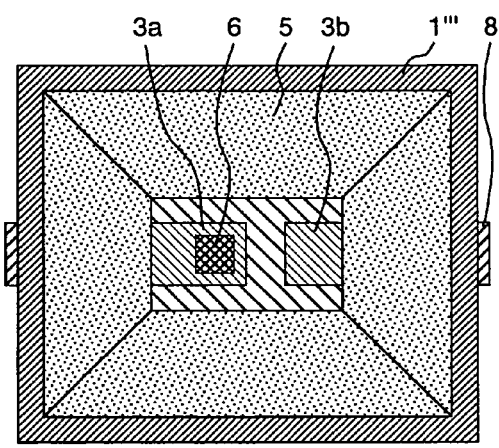
FIG. 6
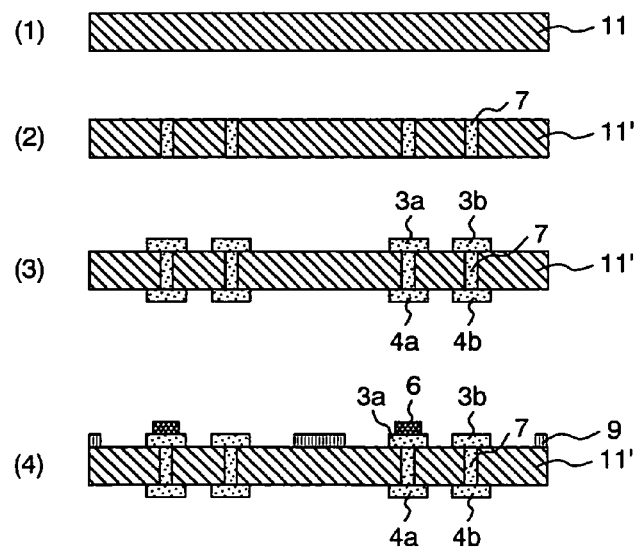

PACKAGE FOR MOUNTING AN OPTICAL ELEMENT AND A METHOD OF MANUFACTURING THE SAME

CLAIM OF PRIORITY

This application claims from Japanese application serial No. 2003-420285, filed on Dec. 18, 2003, the content of which is hereby incorporated by reference into this application.

DESCRIPTION OF THE INVENTION

1. Field of the Invention

The present invention relates to a package for mounting an optical element and a method of manufacturing the same.

2. Related Art

As a package for mounting an optical element, there is disclosed in Japanese patent laid-open H11-265957 (patent document No. 1) a method which comprises: stacking a frame provided with cavities formed by punching a green sheet and a bottom plate made of a green sheet provided with through-holes and a metalizing film, pressing the frame and the bottom plate and sintering them in a reducing atmosphere. Then, the stacking is cut into a predetermined size. Japanese patent laid-open 2000-138305 (Patent document No 2) discloses a method of manufacturing a package wherein a frame made of epoxy resin is molded by a transfer molding and the frame is bonded with a ceramic substrate by an epoxy adhesive.

(Patent document No. 1) Japanese patent laid-open H11-265957

(Patent document No. 2) Japanese patent laid-open 2000-138305

SUMMARY OF THE INVENTION

The present invention relates to a package for mounting an optical element, a module, a package array, a module array and a method of manufacturing them. The bonding reliability between the insulating substrate and the frame, heat dissipation performance, surface conditions and dimension accuracy are improved.

Since the method using the green sheet disclosed in the patent document No. 1 comprises a sintering step, it has such problems as surface roughing of the frame and the bottom plate, decrease in reliability of metalizing due to thermal history, fluctuation of dimensions due to thermal shrinkage, etc. The surface roughing brings about decrease in a contact area between an optical element and the bottom plate. This phenomenon leads to difficulty in dissipation of a lot of heat generated during performance of the optical element so that error performance, thermal destruction, etc. of the optical elements would occur. The thermal history due to sintering not only lowers the reliability of metalizing, but also the thin film solder, low temperature metal material such as aluminum are melted; thus, there is a limitation of construction of the package. The input/output terminals are arranged within an area of the window of the frame so that the optical element mounted on the window is in optical relation with the input/output terminal. This structure is basically the same as the case where a metalizing film formed on the side face and the top and the rear face is used.

Since the method disclosed in patent document No. 2, which uses the frame made of epoxy resin utilizes a molding method for manufacturing the frame, the molds must be prepared in accordance with changing of the shapes of the molds, which leads to fluctuation of dimension of the molds. There may be a possibility of peeling off or cracks due to thermal stress; moreover, heat resistance and thermal conductivity of the epoxy resin are low.

BRIEF DESCRIPTION OF DRAWINGS

FIGS. 5a and 5b show a structure of a package wherein electrical conduction between the both faces of the insulating substrate is secured by metalizing on side faces.

FIG. 6 is a flow chart of a method for processing the insulating substrate.

DETAILED DESCRIPTION OF THE INVENTION

It is an object of the present invention to provide a package for mounting an optical element with high bonding reliability between the insulating substrate and the frame, heat dissipation property, surface conditions and dimension accuracy and a method for manufacturing the same.

The present invention is characterized in that a silicon frame is mounted on an insulating substrate. In the specification, silicon means a single crystal. The frame and the insulating substrate should have linear thermal expansion coefficients close to each other. The coefficient of one of the frame or the substrate should be within a range of 1 to 5 times, particularly within a range of 1 to 3 times that of the other.

The package includes a device comprising at least one frame made of the single crystal silicon having a window for mounting an optical element therein. The window and the input/output terminal are arranged in optical relation so that light emitted from the light emitting diode is received by the lens.

An optical module means a device comprising the optical element mounted on the frame and at least one function element such as light emitting diode, photodiode. The optical element such as a lens and the function element are arranged in optical relation and the function elements are electrically connected.

A package array means an assembly comprising a number of packages arranged in a predetermined pattern each comprising the silicon frame, an insulating substrate, an input/output terminal, an input/output pad electrically connected with the input/output terminal. Each of the oblique faces outwardly spreads with respect to the center axis of the window.

A module array means an assembly comprising a number of the modules each comprising the package and an optical element mounted on the silicon frame and the function element mounted on the input/output terminal.

According to the present invention, it is possible to provide a package for mounting an optical element with bonding reliability between the insulating substrate and the frame, heat dissipation property, surface condition and dimension accuracy and a method for manufacturing the same.

PREFERRED EMBODIMENTS OF THE INVENTION

Packages for mounting optical elements that generate heat such as light emitting diodes, laser diodes should suppress characteristic damage of the elements due to temperature rise. In the embodiments of the present invention, a package structure and a method of manufacturing the same in considering the heat generating elements.

In the embodiments of the present invention, a frame made of silicon is placed on and bonded to an insulating substrate thereby to achieve bonding reliability, surface conditions, dimension accuracy and various layer structures.

Embodiment 1

Figure 1A:
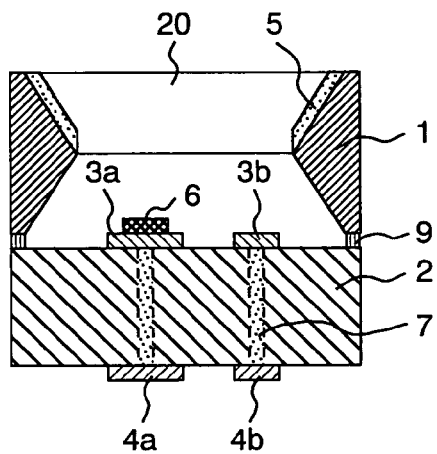
FIGS. 1a and 1b show a structure of a package according to one embodiment of the present invention.

In the following, the embodiment of the present invention will be explained by reference to drawings. FIG. 1(a) is a diagrammatic cross sectional view of a package according to the embodiment and FIG. 1(b) is a plane view of the package.

Figure 1B:
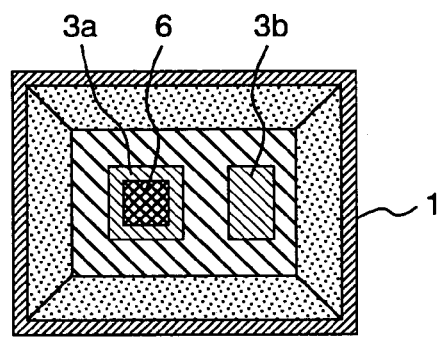

As shown in FIGS. 1(a) and 1(b), the optical element mounting package has a structure wherein a silicon frame 1 prepared by wet etching from the rear face is mounted on an insulating substrate 2. The silicon frame 1 is mounted on the substrate 2 for mounting an optical element. Input/output terminals 3a, 3b are formed on the top surface of the insulating substrate 2 and input/output pads 4a, 4b are formed on the bottom surface of the insulating substrate 2. These are electrically connected by means of conductors or metalizing films formed in through-holes 7. The input/output terminal 3a and the input/output pad 4a are electrically connected by means of the through-hole 7 and the input/output terminal 3b and the input/output pad 4b are electrically connected by means of a conductor in the through-hole 7.

The bonding of the silicon frame 1 and the insulating substrate 2 is carried out at a temperature lower than the melting point of a thin film solder 6 in the package to form the thin film solder 9. An optical element such as a lens is mounted on a window 20 of the frame 1.

When the insulating substrate 2 made of a ceramic substrate such as SiC, AlN, alumina, etc is used, high precision patterning of the input/output terminals 3a, 3b, the input/output pads 4a, 4b and the thin film solder 6 can be carried out.

The silicon frame 1 is formed by wet etching a silicon wafer of a crystal plane (100) in the rear surface thereof; the oblique face of the frame is (111), that is, the angle constituted by the horizontal surface and the oblique face is 54.74 degrees in crystallography. The surface condition of the oblique face is Ra=0.02 to 0.06 μm and the surface condition is much smoother than that of sintered bodies (Ra=about 0.2 μm). Further, an aluminum thin film 5 is formed by vacuum evaporation on the oblique face to improve light reflection property. Instead of the aluminum film, films of Au, Ag, etc can be used. Since the silicon frame 1 and the insulating substrate 2 are bonded after the Al thin film 5 is formed on the oblique face, the Al thin film 5 on the oblique face never touches the insulating substrate 2.

In the structure of FIGS. 1(a) and 1(b), bonding of the insulating substrate 2 and the frame 1 is conducted at the temperature lower than that of the thin film solder 9 in the package. Instead of the thin film solder 9, an Au thin film for solid bonding or an adhesive such as glass, resins, brazing materials can be used.

Then, a method of manufacturing the package will be explained by reference to FIGS. 6, 7 and 8.

At first, a processing step of the insulating substrate is explained by reference to FIG. 6.

(1). A SiC substrate having been subjected to mirror polishing was prepared.

(2). Through-holes 7 were formed in the SiC substrate 11 and the inner faces of the through-holes were metalized.

(3). Input/output terminals 3a, 3b were formed on the top surface of the SiC substrate 11' and input/output pads 4a, 4b were formed on the bottom surface.

(4) A thin film solder 9 for bonding the SiC substrate 11' and a silicon wafer and a thin film solder 6 in the package were formed on the top face of the SiC substrate 11' with the through-holes. The thin film solder 9 should have a melting point lower than that of the thin film solder 6.

A method of processing the silicon frame is explained by reference to FIG. 7, which is a flow chart of processing the silicon wafer.

(1). A silicon wafer 12 was prepared.

(2). After the photolithographic process of both faces of the silicon wafer 12, the silicon wafer 12 was immersed in an alkaline aqueous solution such as a potassium hydroxide aqueous solution to form through-holes.

(3). A metalizing film 13 was formed on the bottom face of the silicon wafer 12' with through-holes. The metalizing film 13 was formed for the purpose of bonding with the thin film.

(4). A reflecting thin film 5 of aluminum was formed on the oblique face of the silicon frame 12' with the through-holes. The film was formed by using a mask to form it only on the oblique faces or on the whole surface of the silicon wafer.

A bonding method of processing after bonding between the silicon wafer 12' with the through-holes and the SiC substrate 11' with the through-holes is explained by reference to FIG. 8.

(1) The SiC substrate 11' with the through-holes and the silicon wafer 12' with the through-holes were bonded by means of the thin film solder 9. The SiC substrate 11' and the silicon wafer 12' were placed on a heater whose temperature was set to 20 to 50° C. higher than the melting point of the thin film solder 9 to carry out the bonding.

(2) The stacked member of the SiC substrate 11' and the silicon wafer 12' was cut into frames of a desired outer size to obtain a desired package.

Figure 9:
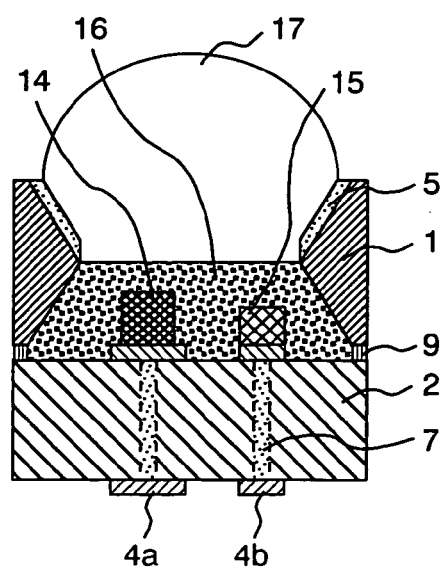
FIG. 9 is a package structure provided with a light emitting diode, a photodiode, a phosphor and a lens.

FIG. 9 shows a cross sectional view of one embodiment of a module comprising a light emitting diode 14, a photodiode 15, a phosphor 16 for guiding light to the lens 17 or from the lens to the diodes, silicon frame 1, SiC insulating substrate 2 having through-holes 7, thin film solder 9, input/output terminal 3a, 3b and input/output pads 4a, 4b. Heat from the light emitting diode 14 is effectively dissipated from the SiC insulating substrate 2. The emitted light is effectively reflected by the aluminum film with excellent reflection property on the oblique faces.

The module and package manufactured in the above-described method have the following advantages compared with the conventional ones using green sheets and epoxy resin frame and ceramic substrates.

Figure 10:
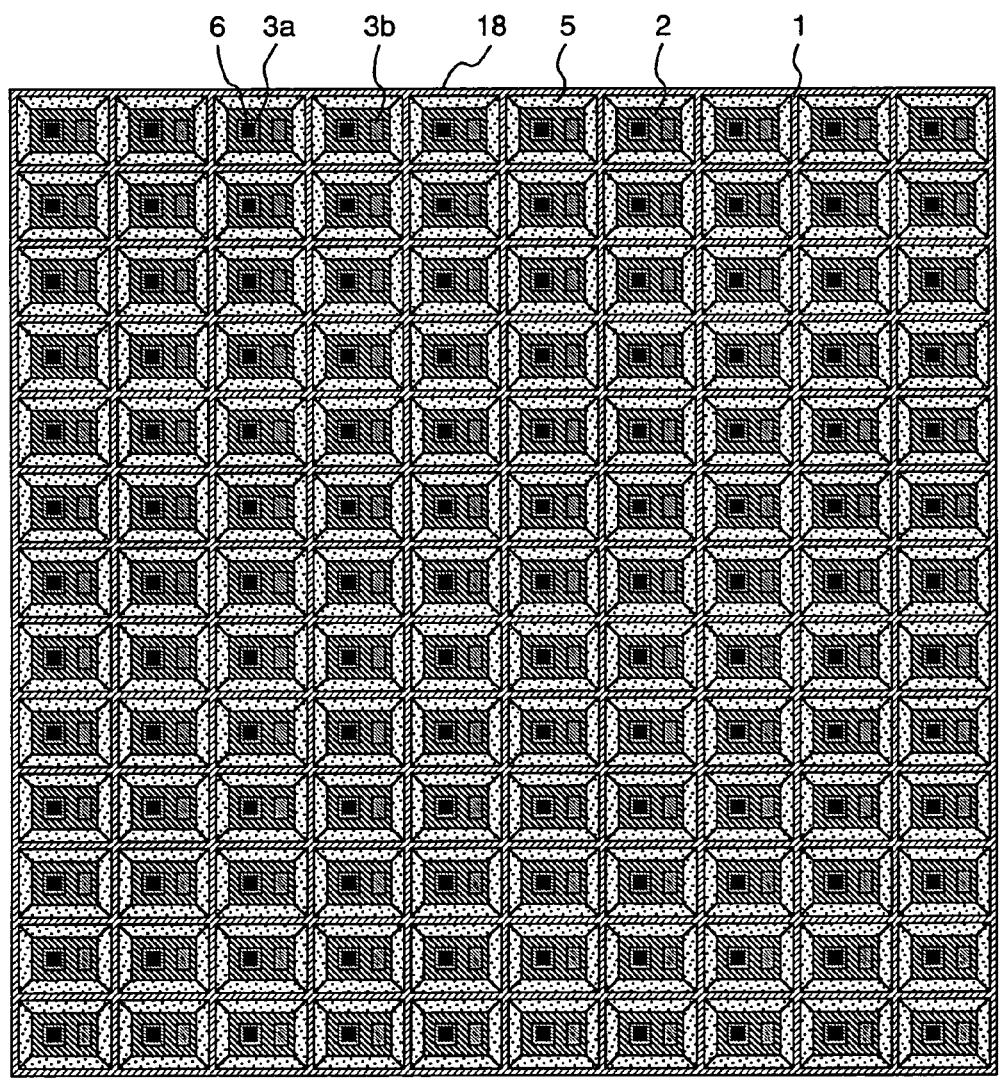
FIG. 10 is a structure of one embodiment according to the present invention wherein a great number of optical elements are mounted.

(1) Since the linear expansion coefficient of single crystal silicon is $3.5 \times 10^{-6}$/K and that of SiC insulating substrate is $3.2\times10^{-6}$/K, they are almost the same. The bonding reliability with respect to the thermal history is remarkably good. Accordingly, not only the small size package shown in FIG. 1 but the wafer size package shown in FIG. 10 consisting of several hundreds to several thousands optical elements can be easily manufactured.

(2) Since the thermal conductivity of SiC is 300 W/m·K and that of silicon is 145 W/m·K, both being quite large, it is easy to dissipate heat from the optical element so that the degradation of performance of the optical element can be prevented.

(3) Since the SiC substrate and the silicon frame are processed in the form of plates, processes for semiconductors such as photolithography can be applied as they are; the packages can be manufactured economically. Since the method does not comprise sintering step, which may bring about thermal shrinkage by sintering, so that the accuracy of the final package product was high.

Embodiment 2

Figure 2A:
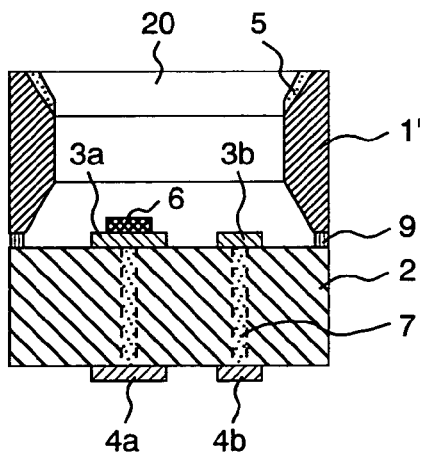
FIGS. 2a and 2b show a structure of a package according to one embodiment of the present invention.
Figure 2B:
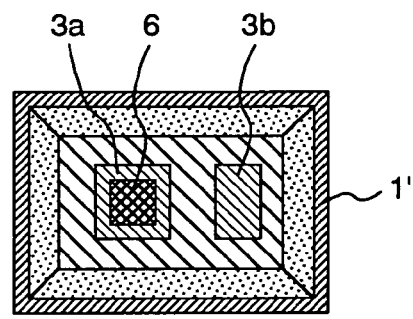

FIG. 2(a) is a diagrammatic cross sectional view of a package of the embodiment of the present invention and FIG. 2(b) is its plane view.

Figure 7:
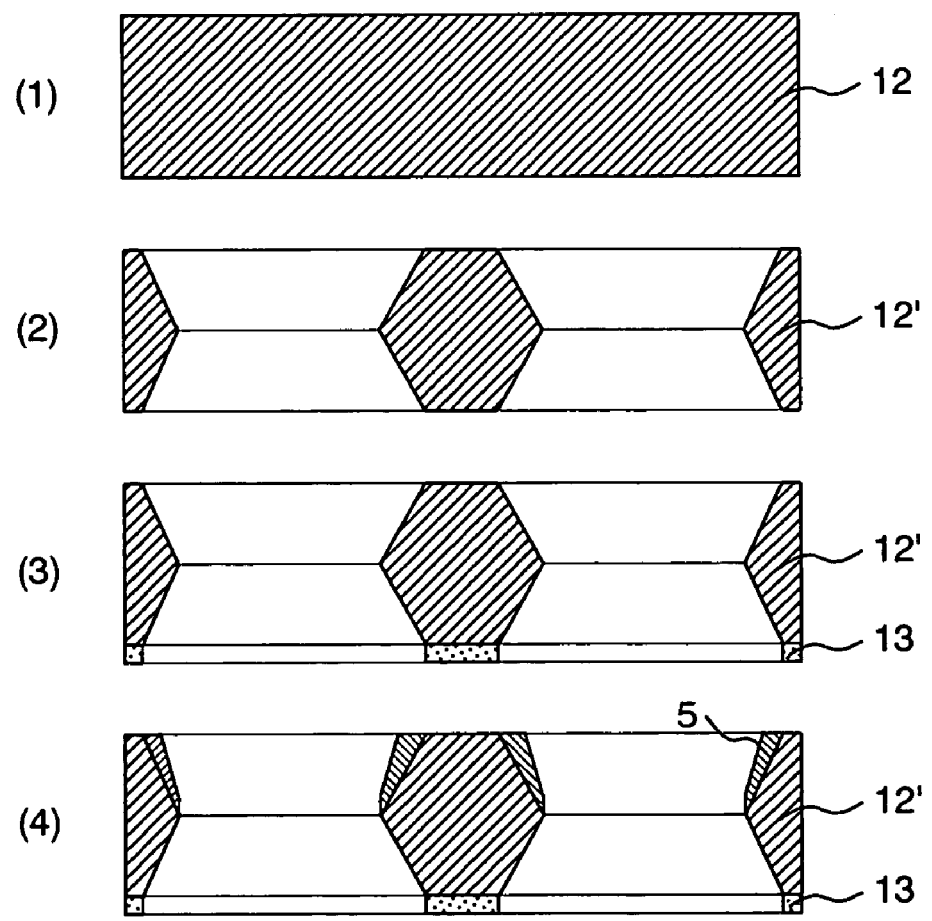
FIG. 7 is a flow chart of a method for processing the silicon frame.
Figure 8:
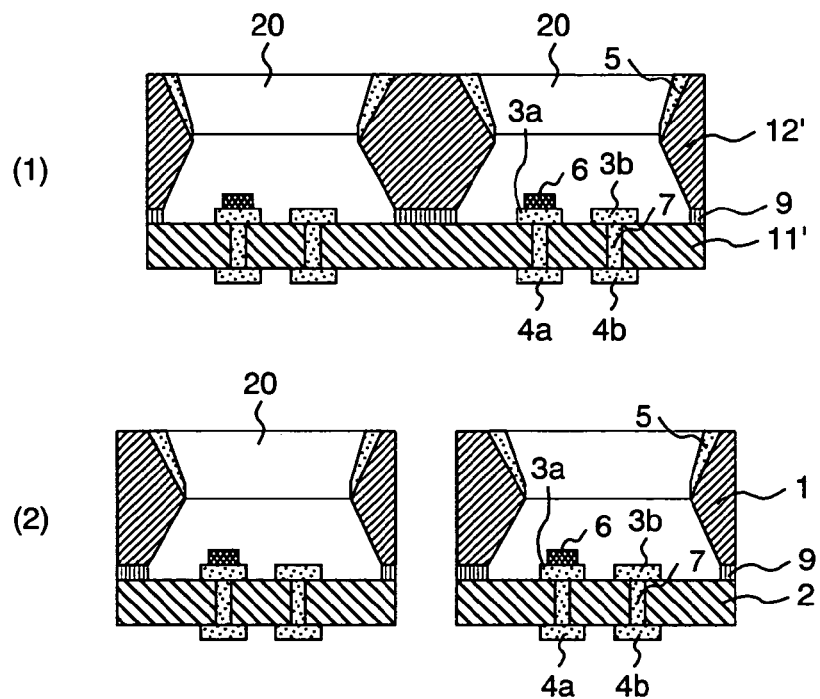
FIG. 8 is a flow chart of a process after bonding the silicon wafer with through-holes and the ceramic substrate with the through-holes.

In the embodiment, the package of embodiment 1 is further downsized, wherein the frame made of silicon wafer 12' shown in FIG. 7 was prepared, then a further etching process was carried out in the both faces. The top portions formed by the oblique faces of 54.74 degrees were etched to a desired extent.

Embodiment 3

Figure 3A:
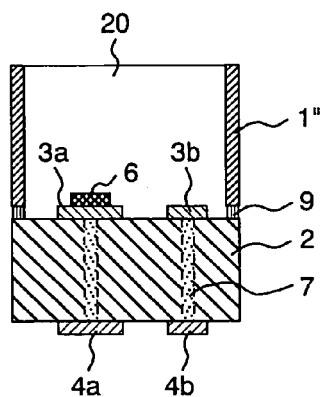
FIGS. 3a and 3b show a structure of a package according to one embodiment of the present invention.
Figure 3B:
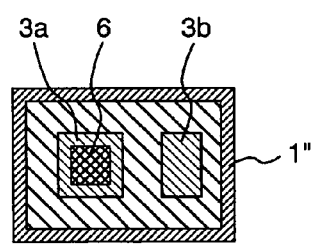

FIG. 3(a) is a diagrammatic cross sectional view of a package of the embodiment and FIG. 3(b) is a plane view.

In this embodiment, the package shown in FIG. 2 is further downsized. After the frame of the silicon wafer 12' shown in FIG. 7 was prepared, an additional wet etching was applied to further process the wafer to completely remove the oblique portions constituted by oblique faces. The structure could be prepared by a dry etching applied to the silicon wafer to form through-holes. The frame 1' made of silicon was formed by a wet etching from both surfaces or by a dry etching.

Embodiment 4

Figure 4A:
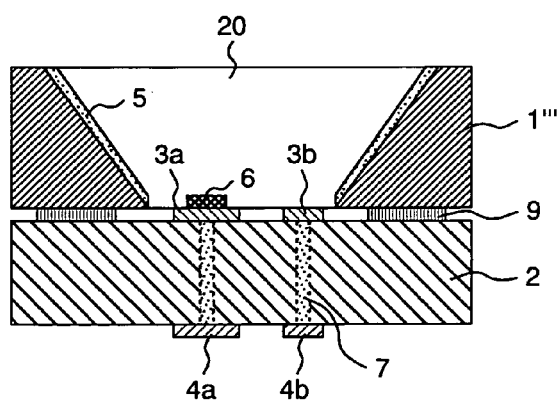
FIGS. 4a and 4b show a structure of a package according to one embodiment wherein the silicon frame is prepared from one surface.
Figure 4B:
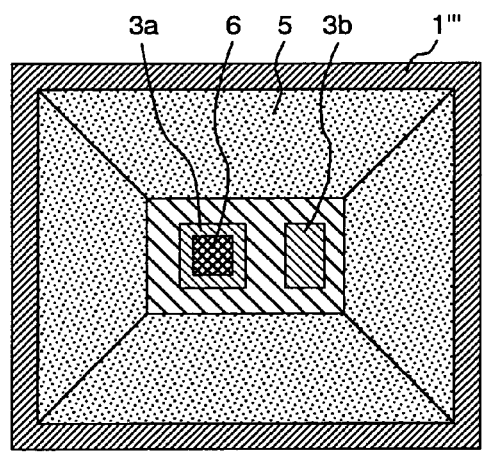

FIG. 4(a) is a diagrammatic cross sectional view of a package according to the embodiment and FIG. 4(b) is its plane view.

In this embodiment, a photolithographic process was applied to one face of the silicon wafer 12'. Although the size of this embodiment was larger than that of the embodiment 1, the reflection efficiency was higher than the embodiment 1 because of its broader area of the oblique faces. The Si frame 1''' is prepared by a wet etching from one surface.

Embodiment 5

FIG. 5(a) is a diagrammatic cross sectional view of a package according to the embodiment and FIG. 5(b) is its plane view.

The package of this embodiment is provided with a metalizing film 8 on the side face, instead of the through-holes in the embodiment 4 to secure the electric conduction between the front and rare faces of the package. The metalizing for conduction on the side face can be applied to embodiments 1, 2 and 3. The metalizing film 8 functions as input/output terminals 3a', 3b' and input/output pads 4a', 4b' as shown in FIG. 5.

What is claimed is:

1. A package for mounting an optical element, comprising an insulating SiC substrate for mounting the optical element thereon and a frame, and wherein said SiC substrate is arranged to dissipate heat from said optical element, and wherein said frame is made of a single crystal silicon and is mounted on the insulating SiC substrate, and wherein said frame has a window with a reflecting film in an inner face thereof for reflecting light emitted from the optical element, the window having a widened opening, the optical element being disposed in the window, and wherein the SiC substrate and the single crystal silicon frame have substantially the same thermal expansion coefficients, and wherein through-holes are formed in the insulating SiC substrate, and wherein said package includes an input/output terminal formed on a top surface of the insulating SiC substrate and an input/output pad formed on a bottom surface of the insulating SiC substrate, and wherein an electrical connection between said input/output terminal formed on the top surface of the insulating SiC substrate and said input/output pad formed on the bottom surface of the insulating SiC substrate is formed by metalizing treatment of the through-holes formed in the insulating SiC substrate; and wherein said window has a narrow portion and a wide portion, said wide portion being located at said opening of said window and being wider than said narrow portion, and said narrow portion being located between said insulating SiC substrate and said wide portion of said window, and wherein said wide portion of said window is arranged to receive a lens for converging light and for transmitting said light through said opening in a direction away from said insulating SiC substrate.

2. A package for mounting an optical element, comprising an insulating SiC substrate for mounting the optical element thereon and a frame, made of a single crystal silicon and mounted on the insulating SiC substrate, having a window with a reflecting film on an oblique face in an inner face thereof for reflecting light emitted from the optical element, and wherein the window has an opening that widens in a direction away from the insulating SiC substrate such that said window has a narrow portion and a wide portion, said wide portion being located at said opening of said window and being wider than said narrow portion, and said narrow portion being located between said insulating SiC substrate and said wide portion of said window, and wherein the optical element is to be disposed in the window, and wherein said wide portion of said window is arranged to receive a lens for converging light and for transmitting said light through said opening in said direction away from said insulating SiC substrate, and wherein the SiC substrate and the single crystal silicon frame have substantially the same thermal expansion coefficients, and wherein an electrical connection between an input/output terminal formed on the top surface of the insulating SiC substrate and an input/output pad formed on the bottom surface of the insulating SiC substrate is formed by a side metalization of the through-holes formed in the insulating SiC substrate.

3. A package for mounting optical elements comprising an insulating SiC substrate for mounting the optical elements thereon and a plurality of frames made of a single crystal silicon and mounted on the insulating SiC substrate, each frame having a window where one of the optical elements is to be disposed, the window having a reflecting film on an oblique face in an inner face thereof for reflecting light emitted from the one optical element, and wherein each window has a widened opening, and wherein the SiC substrate and the single crystal silicon frames have substantially the same thermal expansion coefficients; and wherein each said window has a narrow portion and a wide portion, said wide portion being located at said opening of said window and being wider than said narrow portion, and said narrow portion being located between said insulating SiC substrate and said wide portion of said window, and wherein said wide portion of said window is arranged to receive a lens for converging light and for transmitting said light through said opening in a direction away from said insulating SiC substrate.

4. A package for mounting an optical element comprising an insulating SiC substrate for mounting the optical element thereon and a frame, made of single crystal silicon and mounted on the insulating SiC substrate, having a window with a reflecting film on an oblique face in an inner face thereof for reflecting light emitted from the optical element, the optical element being disposed in the window, and the insulating SiC substrate being bonded to the frame, and wherein the insulating SiC substrate has an input/output terminal on one face and an input/output pad on the other face, the terminal and the pad being electrically connected by means of a conductor formed in a through-hole in the insulating SiC substrate and the input/output terminal being arranged within an area of the window, and wherein the window has a widened opening, and wherein the SiC substrate and the single crystal silicon frame have substantially the same thermal expansion coefficients; and wherein said window has a narrow portion and a wide portion, said wide portion being located at said opening of said window and being wider than said narrow portion, and said narrow portion being located between said insulating SiC substrate and said wide portion of said window, and wherein said wide portion of said window is arranged to receive a lens for converging light and for transmitting said light through said opening in a direction away from said insulating SiC substrate.

5. The package according to claim 4, wherein the window of the frame has oblique faces where the optical element is mounted, each of the oblique faces outwardly spreading with respect to the center axis of the window.

6. A package array constituted by a number of packages each being defined in claim 4.

7. The package according to claim 1, wherein the frame has a face constituted by a flat face of the insulating substrate and having 54.74 degrees.

8. A package for mounting an optical element comprising an insulating SiC substrate for mounting the optical element, and a frame, made of single crystal silicon and mounted on the insulating SiC substrate, having a window where the optical element is to be disposed in the window, the window having a reflecting film on an oblique face in an inner face thereof for reflecting light emitted from the optical element, and wherein the window has a widened opening, and wherein the SiC substrate and the single crystal silicon frame have substantially the same thermal expansion coefficients; and wherein said window has a narrow portion and a wide portion, said wide portion being located at said opening of said window and being wider than said narrow portion, and said narrow portion being located between said insulating SiC substrate and said wide portion of said window, and wherein said wide portion of said window is arranged to receive a lens for converging light and for transmitting said light through said opening in a direction away from said insulating SiC substrate.

9. A package for mounting a plurality of optical elements comprising an insulating SiC substrate for mounting the optical elements, and a plurality of frames, made of single crystal silicon and mounted on the insulating SiC substrate, each having a window having a reflecting film on an inner face thereof for reflecting light emitted from a respective one of the optical elements, and wherein the window has a widened opening, and wherein the SiC substrate and the single crystal silicon frames have substantially the same thermal expansion coefficients; and wherein each said window has a narrow portion and a wide portion, said wide portion being located at said opening of said window and being wider than said narrow portion, and said narrow portion being located between said insulating SiC substrate and said wide portion of said window, and wherein the optical element is to be disposed in the window, and wherein said wide portion of said window is arranged to receive a lens for converging light and for transmitting said light through said opening in a direction away from said insulating SiC substrate.

10. A package for mounting optical elements comprising an insulating SiC substrate and a large number of frames made of single crystal silicon bonded and mounted on the insulating SiC substrate, each of the frames having a window for accommodating each of the optical elements therein, wherein each window has a reflecting film on an oblique face in an inner face thereof for reflecting light emitted from a respective one of the optical elements, and wherein the window has a widened opening, and wherein the SiC substrate and the single crystal silicon frames have substantially the same thermal expansion coefficients; and wherein each said window has a narrow portion and a wide portion, said wide portion being located at said opening of said window and being wider than said narrow portion, and said narrow portion being located between said insulating SiC substrate and said wide portion of said window, and wherein the optical element is to be disposed in the window, and wherein said wide portion of said window is arranged to receive a lens for converging light and for transmitting said light through said opening in a direction away from said insulating SiC substrate.

11. The package according to claim 8, wherein the oblique face has an angle of about 54.74 degrees with respect to a flat face of the insulating SiC substrate.

12. The package according to claim 8, wherein the oblique face comprises at least two parts, whereby the window is widened at its top and bottom, and is shrunk at its point between the top and bottom.

13. The package according to claim 8, wherein the window has one oblique face and is widened at its top.

14. The package according to claim 9, wherein the oblique face has an angle of about 54.74 degrees with respect to a flat face of the insulating SiC substrate.

15. The package according to claim 9, wherein the oblique face comprises at least two parts, whereby the window is widened at its top and bottom, and is shrunk at its point between the top and bottom.

16. The package according to claim 9, wherein the window has one oblique face and is widened at its top.

17. A package for mounting optical elements comprising an insulating SiC substrate and a large number of frames made of single crystal silicon bonded and mounted on the insulating SiC substrate, each of the frames having a window for accommodating each of the optical elements therein, where the optical elements are disposed in a material containing phosphor in the windows, and wherein each window has a reflecting film on an oblique face in an inner face thereof for reflecting light emitted from the optical element, and wherein each window has a widened opening, and wherein the SiC substrate and the single crystal silicon frames have substantially the same thermal expansion coefficients; and wherein each said window has a narrow portion and a wide portion, said wide portion being located at said opening of said window and being wider than said narrow portion, and said narrow portion being located between said insulating SiC substrate and said wide portion of said window, and wherein said wide portion of said window is arranged to receive a lens for converging light and for transmitting said light through said opening in a direction away from said insulating SiC substrate.

18. The package according to claim 17, wherein the oblique face has an angle of about 54.74 degrees with respect to a flat face of the insulating SiC substrate.

19. The package according to claim 17, wherein the oblique face comprises at least two parts, whereby the window is widened at its top and bottom, and is shrunk at its point between the top and bottom.

20. The package according to claim 17, wherein the window has one oblique face and is widened at its top.

* * * * *